(12) United States Patent
Wang et al.

(10) Patent No.: US 9,865,460 B2
(45) Date of Patent: Jan. 9, 2018

(54) SEMICONDUCTOR DEVICE HAVING FIN-TYPE CHANNEL AND METHOD FOR FORMING THE SAME

(71) Applicant: Taiwan Semiconductor Manufacturing Company Limited, Hsinchu (TW)

(72) Inventors: Chien-Hsun Wang, Hsinchu (TW); Chun-Hsiung Lin, Hsinchu County (TW); Mao-Lin Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/862,506

(22) Filed: Sep. 23, 2015

(65) Prior Publication Data
US 2016/0013054 A1 Jan. 14, 2016

Related U.S. Application Data

(62) Division of application No. 14/079,681, filed on Nov. 14, 2013, now Pat. No. 9,147,766.

(51) Int. Cl.
*H01L 21/02* (2006.01)
*H01L 29/78* (2006.01)
*H01L 29/66* (2006.01)

(52) U.S. Cl.
CPC .. *H01L 21/02507* (2013.01); *H01L 21/02538* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 7,098,477 | B2 | 8/2006 | Zhu et al. | |
| 2012/0319192 | A1 | 12/2012 | Lim et al. | |
| 2014/0091360 | A1* | 4/2014 | Pillarisetty | H01L 21/8258 257/190 |

* cited by examiner

*Primary Examiner* — Ali Naraghi
(74) *Attorney, Agent, or Firm* — Jones Day (57) ABSTRACT

A method for forming a semiconductor device having a fin-type channel is provided. The method may include the following operations: forming a first buffer layer over a substrate; forming a first dielectric layer over the first buffer layer; patterning the first dielectric layer over the first buffer layer; forming a barrier layer over the first buffer layer; forming a second dielectric layer over the barrier layer; patterning the second dielectric layer over the barrier layer; forming a channel layer over the barrier layer; and patterning the second dielectric layer, such that at least a portion of the channel layer protrudes to form the fin-type channel.

20 Claims, 11 Drawing Sheets

SEMICONDUCTOR DEVICE HAVING FIN-TYPE CHANNEL AND METHOD FOR FORMING THE SAME

CROSS-REFERENCE TO RELATED APPLICATIONS

This application is a divisional application of U.S. patent application Ser. No. 14/079,681, entitled "SEMICONDUCTOR DEVICE HAVING FIN-TYPE CHANNEL AND METHOD FOR FORMING THE SAME," filed Nov. 14, 2013, which is incorporated herein by reference in its entirety.

FIELD

This disclosure relates generally to semiconductor processes, and, more particularly, to a semiconductor device having a fin-type channel and method for forming the same.

BACKGROUND

Semiconductor devices with fin-type channels are more and more popular. However, fabrication of fin-type channels is difficult due to tight design rules for the width, the spacing, the depth, and the complication of the process. Furthermore, the narrow process window of devices with fin-type channels makes etching processes and forming processes (such as epitaxy) more difficult.

SUMMARY

According to an embodiment of the invention, a semiconductor device having a fin-type channel is provided. The semiconductor device includes: a substrate; a first buffer layer above at least a portion of the substrate; a barrier layer above at least a portion of the first buffer layer; a fin-type channel layer over the barrier layer; wherein a width of the fin-type channel layer is smaller than a width of the first buffer layer. According to another embodiment of the invention, an electronic device is provided. The electronic device includes a semiconductor device having a fin-type channel.

According to an embodiment of the invention, a method for forming a semiconductor device having a fin-type channel is provided. The method includes the following operations: forming a first buffer layer over a substrate; forming a first dielectric layer over the first buffer layer; patterning the first dielectric layer over the first buffer layer; forming a barrier layer over the first buffer layer; forming a second dielectric layer over the barrier layer; patterning the second dielectric layer over the barrier layer; forming a channel layer over the barrier layer; and patterning the second dielectric layer, such that at least a portion of the channel layer protrudes to form the fin-type channel.

BRIEF DESCRIPTION OF THE DRAWINGS

FIG. 7-0 is a sectional view illustrating forming of the second buffer layer according to the embodiment of the invention.

FIG. 7-1 is a sectional view illustrating forming of a barrier layer according to the embodiment of the invention.

FIG. 7-2 is a sectional view illustrating forming of a barrier layer according to the embodiment of the invention.

FIG. 8-0 is a sectional view illustrating forming of the barrier layer according to the embodiment of the invention.

FIG. 8-1 is a sectional view illustrating performing of chemical mechanical polishing on the barrier layer according to the embodiment of the invention.

DETAILED DESCRIPTION

Reference will now be made in detail to exemplary embodiments, which are illustrated in the accompanying drawings. Wherever possible, the same reference numbers will be used throughout the drawings to refer to the same or like parts.

An operation of patterning a layer may include, for example, etching the layer, etching-back the layer, or using a photoresist to define an etching region of the layer and then removing the etching region of the layer.

In the embodiment of the invention, the substrate may be formed of Silicon while the channel layer may be formed of III-V compounds (such as Indium arsenide (InAs), Indium gallium arsenide (InGaAs) or Gallium indium antimonide (InGaSb)). For example, assuming the first set having Germanium (Ge), Gallium Arsenide (GaAs) and Aluminium Arsenide (AlAs), the second set having Indium phosphide (InP) and Indium gallium arsenide (InGaAs(In=0.53, Ga=0.47)), and the third set having Indium arsenide (InAs), Gallium antimonide (GaSb) and Aluminium antimonide (AlSb), the lattice mismatch between the first set and Silicon is about four percent, the lattice mismatch between the second set and Silicon is about eight percent, and the lattice mismatch between the first set and Silicon is about twelve percent. The lattice mismatch between the substrate and the channel layer may degrade adherence between layers so that at least one buffer layer may be utilized therebetween to alleviate said issue.

In addition, Schottky Barrier Height (SBH) of the materials used in the embodiment may affect contact resistance between the materials. For example, In(0.85)Ga(0.15)As has a SBH of 0 eV. In(0.53)Ga(0.47)As has a SBH of +0.28 eV. InAs has a SBH of −0.07 eV. GaAs has a SBH of +0.96 eV. The lower Schottky Barrier Height is, the better the contact resistance is. So proper selection of the materials in view of SBH may improve the contact resistance.

Figure 1:
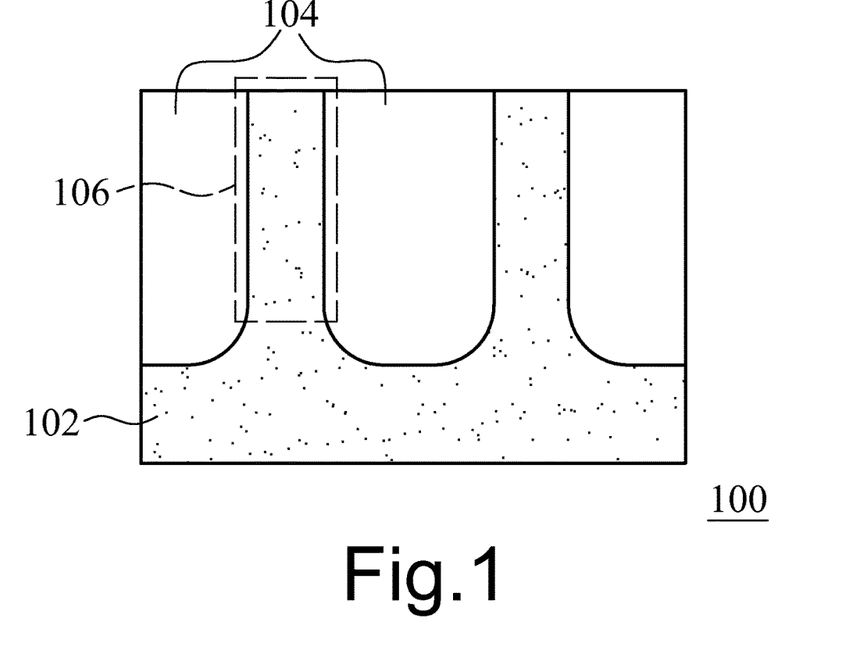
FIG. 1 is a sectional view illustrating an exemplary structure for forming a semiconductor device having a fin-type channel according to an embodiment of the invention.

FIG. 1 is a sectional view illustrating an exemplary structure for forming a semiconductor device having a fin-type channel according to an embodiment of the invention. As shown in FIG. 1, a substrate 102 may be provided in a semiconductor device 100. Regions 106 for forming fin-type channels are separated by shallow trench isolations 104. The substrate 102 may be formed of Silicon or III-V compounds.

Figure 2:
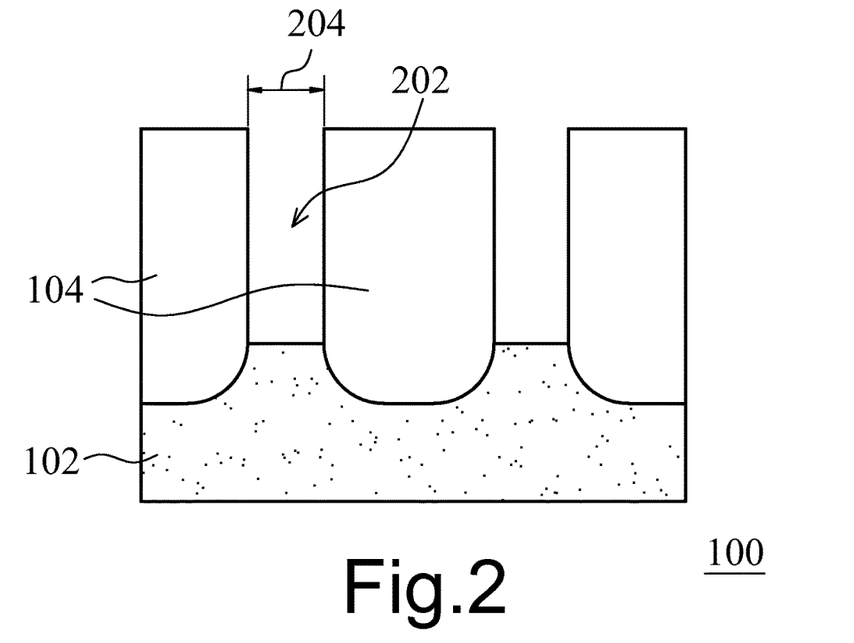
FIG. 2 is a sectional view illustrating patterning of the substrate according to the embodiment of the invention.

FIG. 2 is a sectional view illustrating patterning of the substrate according to the embodiment of the invention. As shown in FIG. 2, a mask (not shown) may be used to define an etching region for the substrate 102. Then, a portion of the substrate 102 may be removed by, for example, an etching process. A first recess 202 is formed accordingly. A width 204 of the first recess 202 may be, but is not limited to, greater than 0.1 micro meters.

Figure 3:
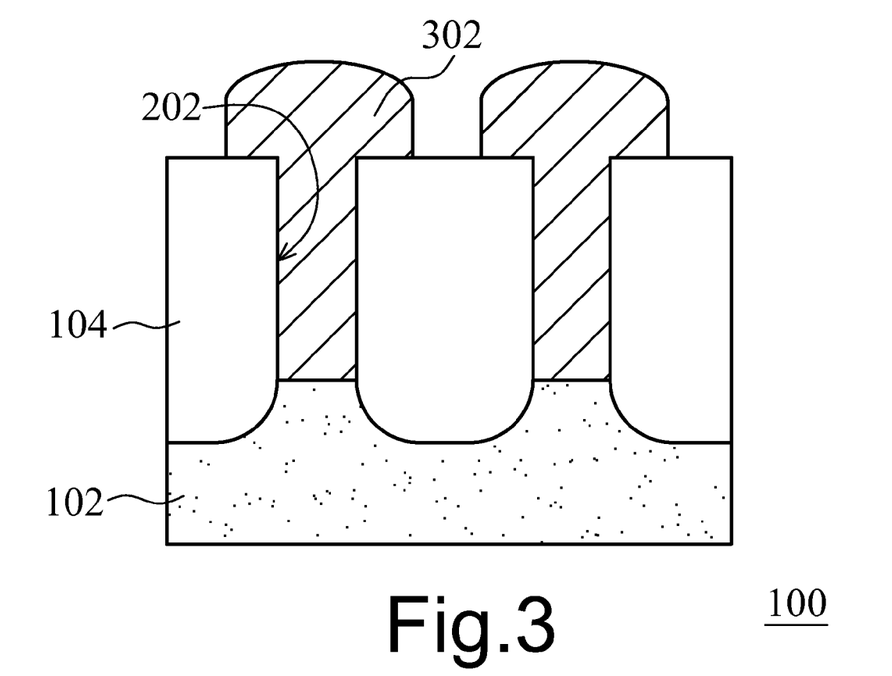
FIG. 3 is a sectional view illustrating forming of the first buffer layer according to the embodiment of the invention.

FIG. 3 is a sectional view illustrating forming of the first buffer layer according to the embodiment of the invention. As shown in FIG. 3, a first buffer layer 302 may be formed over the substrate 102 and may be formed in the first recess 202. The first buffer layer 302 may be formed of, but not limited thereto, Indium phosphide (InP) or Gallium arsenide (GaAs).

Figure 4:
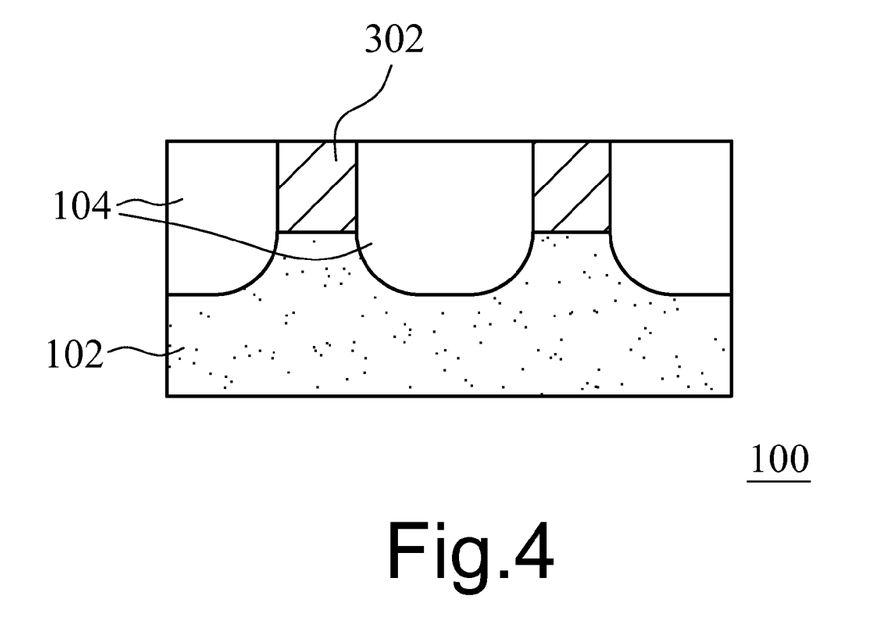
FIG. 4 is a sectional view illustrating performing of chemical mechanical polishing on the first buffer layer according to the embodiment of the invention.

FIG. 4 is a sectional view illustrating performing of chemical mechanical polishing on the first buffer layer according to the embodiment of the invention. As shown in FIG. 4, chemical mechanical polishing may be performed on the first buffer layer 302 and stop on the shallow trench isolations 104 in order to prepare for deposition of a first dielectric layer.

Figure 5:
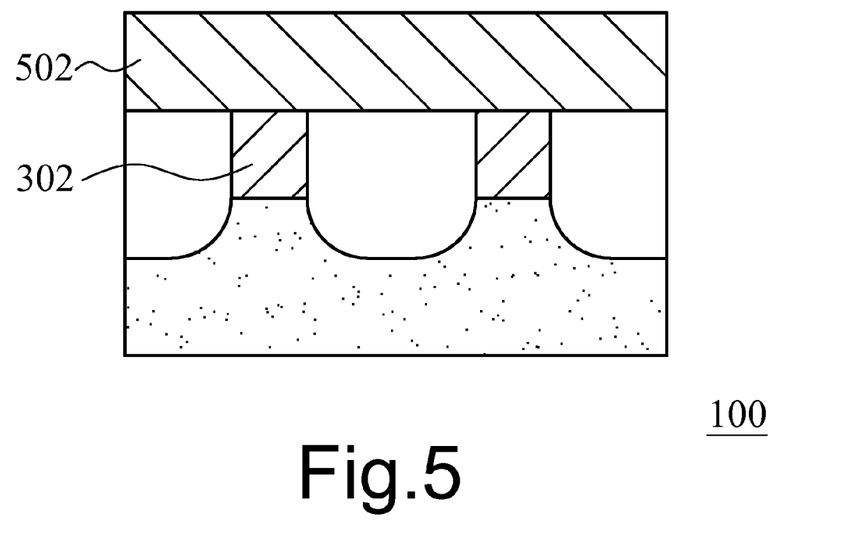
FIG. 5 is a sectional view illustrating forming of the first dielectric layer according to the embodiment of the invention.

FIG. 5 is a sectional view illustrating forming of the first dielectric layer according to the embodiment of the invention. As shown in FIG. 5, a first dielectric layer 502 may be formed over the first buffer layer 302. The first dielectric layer 502 may be formed of, but not limited thereto, Silicon Oxide.

Figure 6:
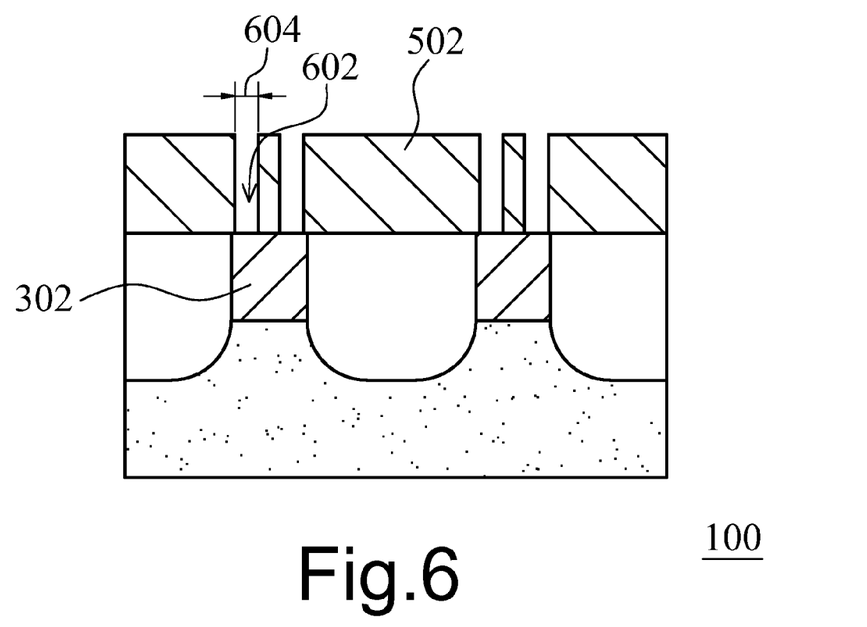
FIG. 6 is a sectional view illustrating patterning of the first dielectric layer according to the embodiment of the invention.

FIG. 6 is a sectional view illustrating patterning of the first dielectric layer according to the embodiment of the invention. As shown in FIG. 6, a mask (not shown) may be used to define an etching region for the first dielectric layer 502. Then, a portion of the first dielectric layer 502 may be removed by, for example, an etching process. A second recess 602 is formed accordingly. A width 604 of the second recess 602 may be smaller than the width 204 of the first recess 202.

Figure 70:
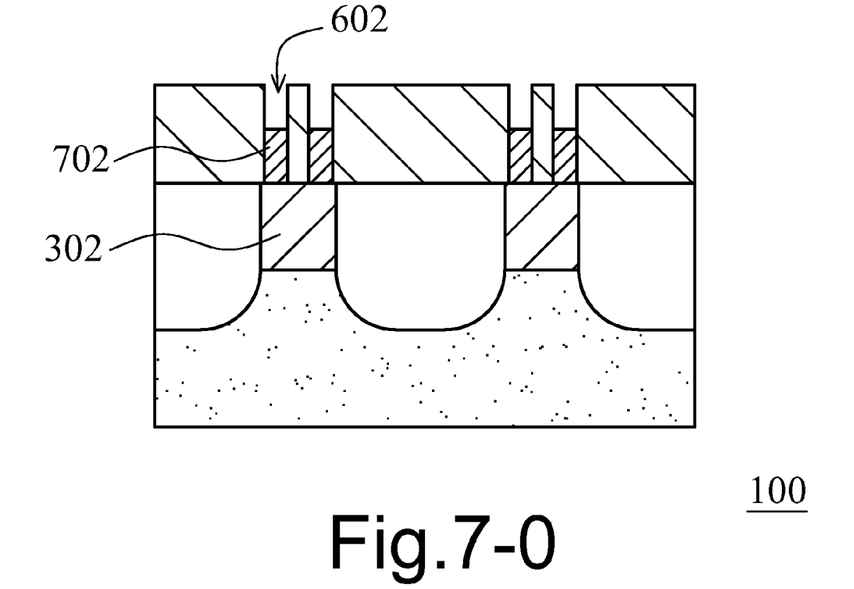

FIG. 7-0 is a sectional view illustrating forming of a second buffer layer according to the embodiment of the invention. Continuing from FIG. 6, as shown in FIG. 7-0, the second buffer layer 702 may be formed over the first buffer layer 302 and may be formed in the second recess 602. The second buffer layer 702 may be formed of, but not limited thereto, Indium phosphide (InP).

Figure 71:
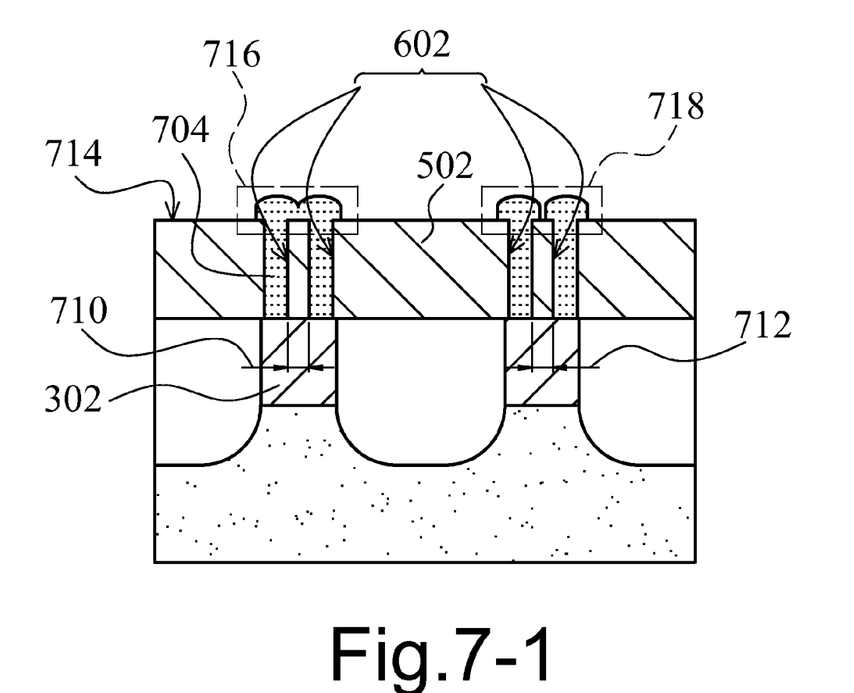

FIG. 7-1 is a sectional view illustrating forming of a barrier layer according to the embodiment of the invention. In the embodiment of the invention, a second buffer layer may not be required, so only the first buffer layer 302 is used. Continuing from FIG. 6, as shown in FIG. 7-1, a barrier layer 704 may be formed over the first buffer layer 302 and may be formed in the second recess 602. The barrier layer 704 may be formed from, but not limited to, Aluminium indium arsenide (AlInAs) or Aluminium Arsenide Antimonide (AlAsSb).

Furthermore, after forming barrier layer 704, a merger of portions of the barrier layer 704 over a top surface 714 of the first dielectric layer 502 may occur based on the spacing 710 of the second recesses 602. For example, a merger of portions 716 of the barrier layer 704 over the top surface 714 of the first dielectric layer 502 occurs because of a smaller spacing 710. A merger of portions 718 of the barrier layer 704 over the top surface 714 of the first dielectric layer 502 may not necessarily occur based on a larger spacing 712. It is noted that the spacing 710, 712 in the drawings are for reference only and do not necessarily represent the actual size.

Figure 72:
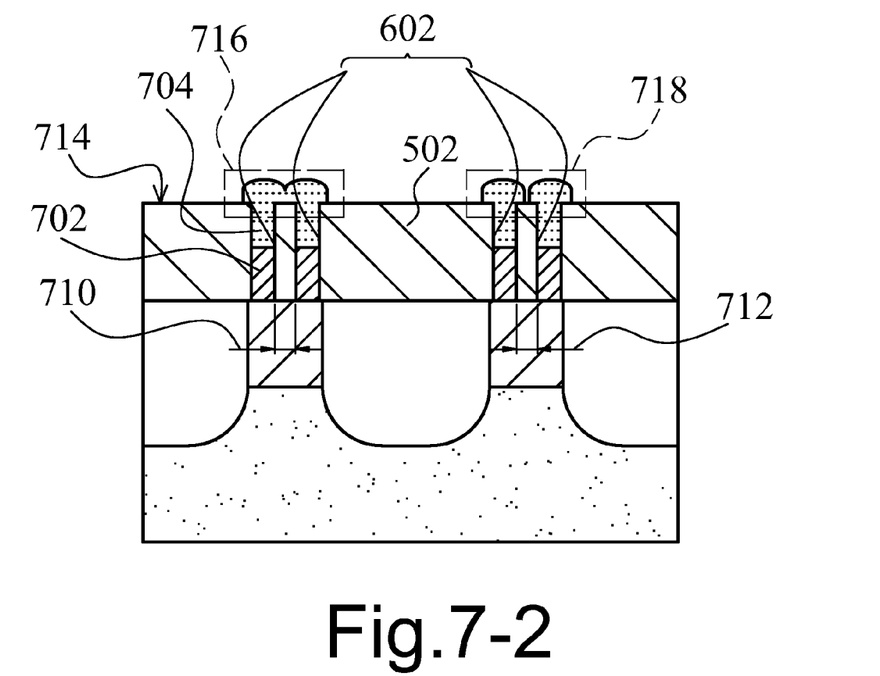

FIG. 7-2 is a sectional view illustrating forming of a barrier layer according to the embodiment of the invention. Continuing from FIG. 7-0, as shown in FIG. 7-2, a barrier layer 704 may be formed over the second buffer layer 702 and may be formed in the second recess 602. The barrier layer 704 may be formed from, but not limited to, Aluminium indium arsenide (AlInAs) or Aluminium Arsenide Antimonide (AlAsSb).

Furthermore, after forming barrier layer 704, a merger of portions of the barrier layer 704 over a top surface 714 of the first dielectric layer 502 may occur based on the spacing 710 of the second recesses 602. For example, a merger of portions 716 of the barrier layer 704 over the top surface 714 of the first dielectric layer 502 occurs because of a smaller spacing 710. A merger of portions 718 of the barrier layer 704 over the top surface 714 of the first dielectric layer 502 does not necessarily occur based on a larger spacing 712. It is noted that the spacing 710, 712 in the drawings are for reference only and may not necessarily represent the actual size.

Figure 80:
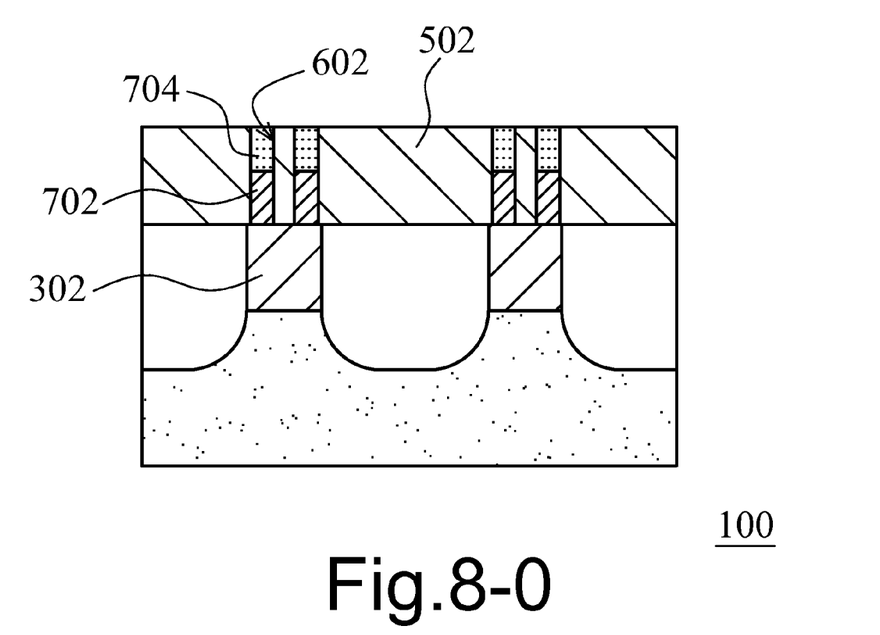
Figure 81:
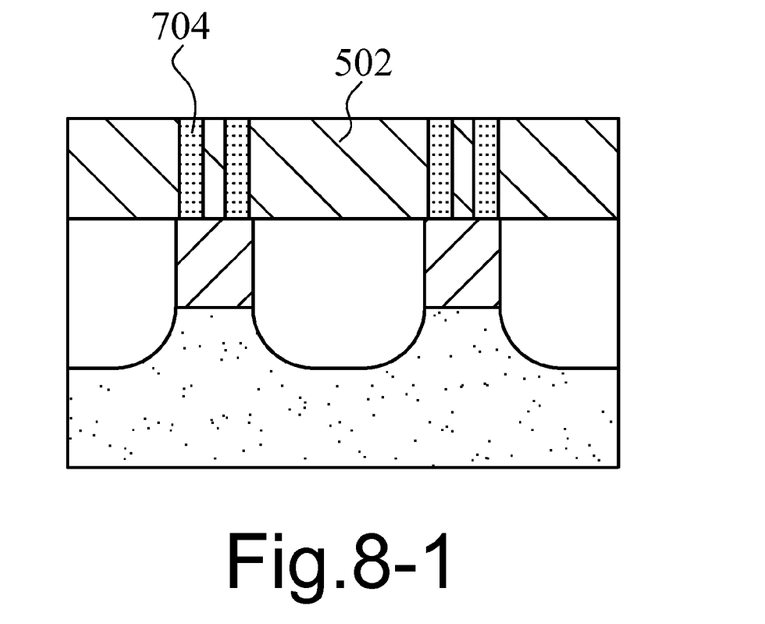

FIG. 8-0 is a sectional view illustrating forming of a barrier layer according to the embodiment of the invention. Continuing from FIG. 7-2, As shown in FIG. 8-0, the barrier layer 704 may be formed over the first buffer layer 302 and may be formed in the second recess 602. Chemical mechanical polishing may be performed on the barrier layer 704 and stop on the first dielectric layer 502. The barrier layer 704 may be formed from, but not limited to, Aluminium indium arsenide (AlInAs) or Aluminium Arsenide Antimonide (AlAsSb).

In the embodiment of the invention, the barrier layer 704 may be formed directly on the second buffer layer 702. In another embodiment of the invention, the second buffer layer 702 may not be formed, and the barrier layer 704 may be formed directly on the first buffer layer 302.

FIG. 8-1 is a sectional view illustrating performing of chemical mechanical polishing on the barrier layer according to the embodiment of the invention. Continuing from FIG. 7-1, as shown in FIG. 8-1, chemical mechanical polishing may be performed on the barrier layer 704 and stop about on the first dielectric layer 502. The operations that includes forming of the second dielectric layer, patterning of the second dielectric layer, forming of the channel layer, and etching back of the second dielectric layer shown in FIGS. 9-12 may be performed in the continuation of FIG. 8-1. For example, a second dielectric layer may be formed over the barrier layer 704.

Figure 9:
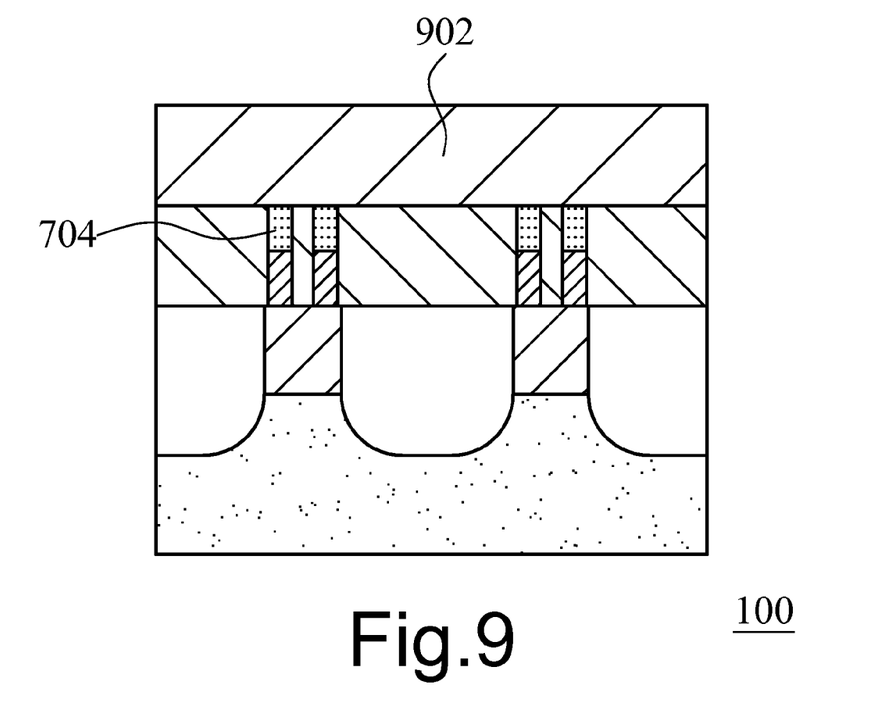
FIG. 9 is a sectional view illustrating forming of the second dielectric layer according to the embodiment of the invention.

FIG. 9 is a sectional view illustrating forming of the second dielectric layer according to the embodiment of the invention. As shown in FIG. 9, a second dielectric layer 902 may be formed over the barrier layer 704. The second dielectric layer 902 may be formed of, but not limited thereto, Silicon Oxide.

Figure 10:
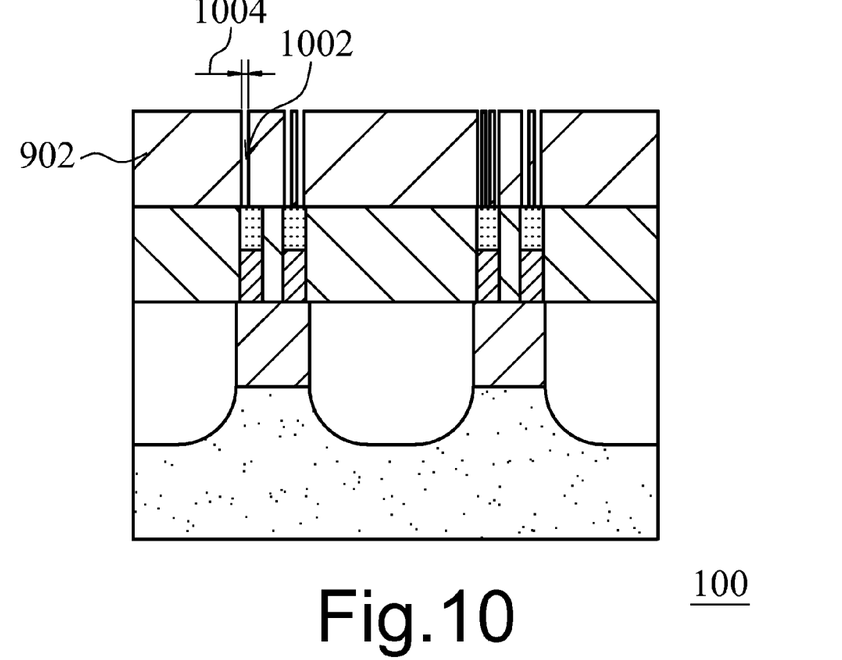
FIG. 10 is a sectional view illustrating patterning of the second dielectric layer according to the embodiment of the invention.

FIG. 10 is a sectional view illustrating patterning of the second dielectric layer according to the embodiment of the invention. As shown in FIG. 10, a mask (not shown) may be used to define an etching region for the second dielectric layer 902. Then, a portion of the second dielectric layer 902 may be removed by, for example, an etching process. A third recess 1002 is formed accordingly. A width 1004 of the third recess 1002 may be smaller than the width 604 of the second recess 602. The width 1004 of the third recess 1002 may be, but not limited thereto, less than 0.2 micro meters.

Figure 11:
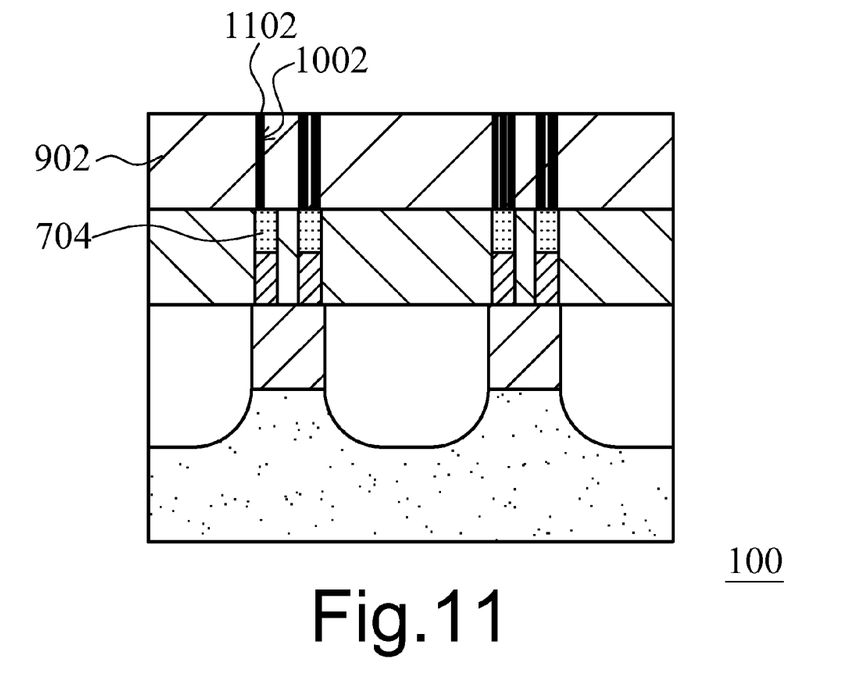
FIG. 11 is a sectional view illustrating forming of the channel layer according to the embodiment of the invention.

FIG. 11 is a sectional view illustrating forming of a channel layer according to the embodiment of the invention. As shown in FIG. 11, the channel layer 1102 may be formed over the barrier layer 704 and may be formed in the third recess 1002. Chemical mechanical polishing may be performed on the channel layer 1102, stopping at the second dielectric layer 902. The channel layer 1102 may be formed of, but not limited thereto, Indium arsenide (InAs), Indium gallium arsenide (InGaAs) or Gallium indium antimonide (InGaSb).

Figure 12:
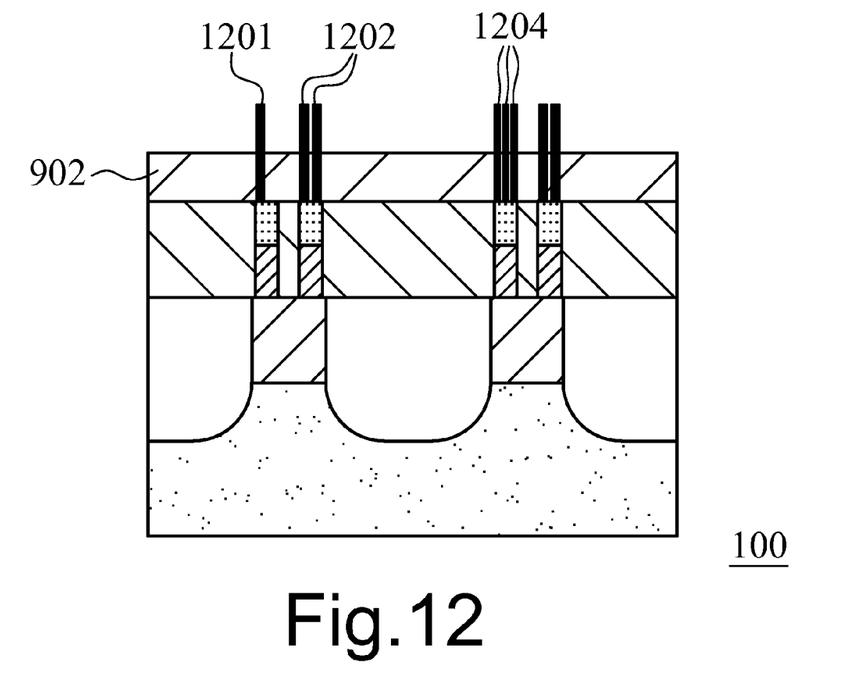
FIG. 12 is a sectional view illustrating etching back of the second dielectric layer according to the embodiment of the invention.

FIG. 12 is a sectional view illustrating etching back of the second dielectric layer according to the embodiment of the invention. As shown in FIG. 12, a mask (not shown) may be used to define an etching region for the second dielectric layer 902. Then, a portion of the second dielectric layer 902 may be removed by, for example, an etching back process. A portion of the channel layer protrudes to form the fin-type channel 1201. Therefore, the semiconductor device 100 having a fin-type channel 1201 is formed.

In the embodiment of the invention, the semiconductor device 100 may include more fin-type channels, such as a first set 1202 of fin-type channels and a second set 1204 of fin-type channels, which are formed according to the embodiment of the invention. The width of each of the fin-type channels of 1102, 1202, 1204 may be different. The number of fin-type channels in the sets 1202, 1204 may be varied according to the circuit implementation.

In the embodiment of the invention, the barrier layer and the buffer layer in the semiconductor device has a more relaxed width/spacing instead of tighter design rules. In addition, due to the relaxed width of said layers, the process window of the semiconductor devices with fin-type channels may increase instead of narrow process windows.

Figure 13:
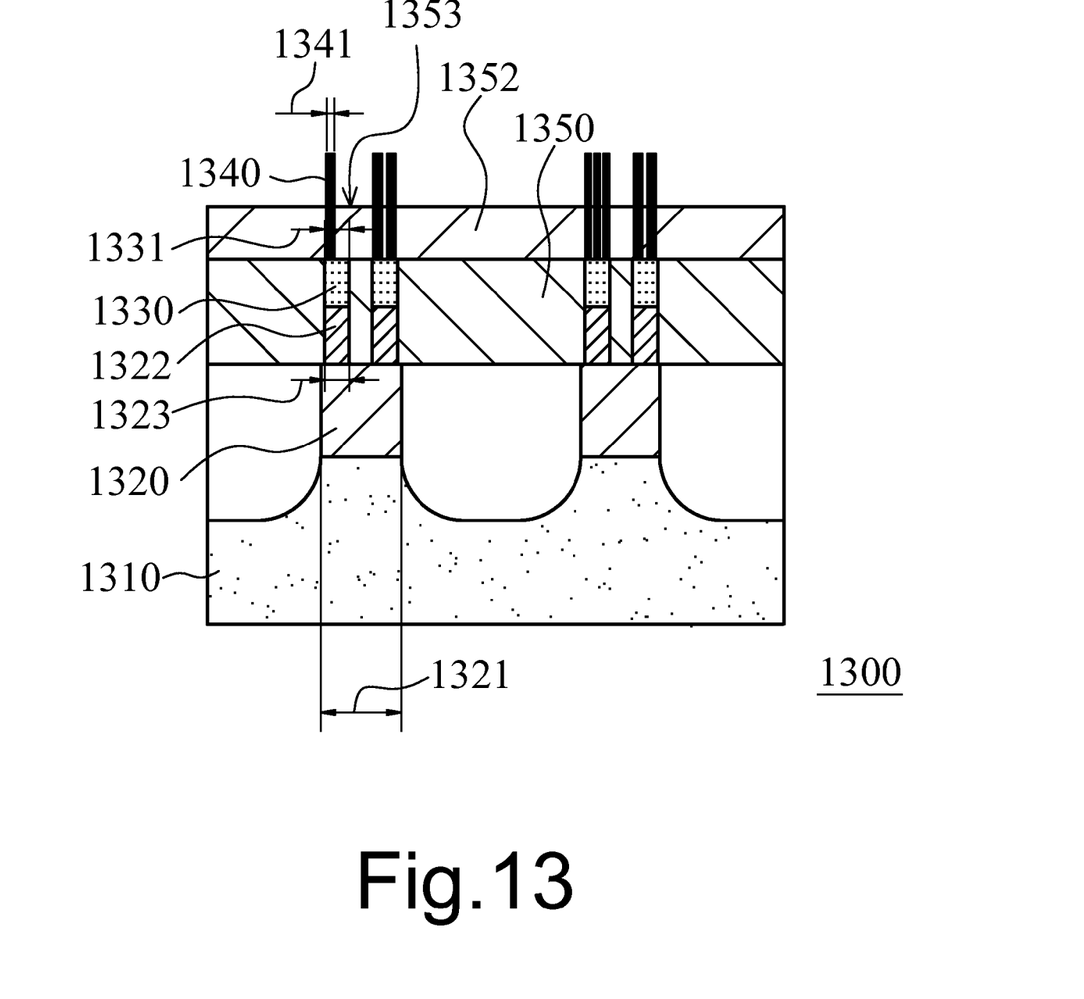
FIG. 13 is a sectional view of a semiconductor device having the fin-type channel according to an embodiment of the invention.

FIG. 13 is a sectional view of a semiconductor device having a fin-type channel according to an embodiment of the invention. As shown in FIG. 13, the semiconductor device 1300 may include a substrate 1310, a first buffer layer 1320, a second buffer layer 1322, a barrier layer 1330 and a fin-type channel layer 1340. The substrate 1310 may be provided in the semiconductor device 1300. The first buffer layer 1320 may be disposed above at least a portion of the substrate 1310. The barrier layer 1330 may be disposed above at least a portion of the first buffer layer 1320. The fin-type channel layer 1340 may be disposed over the barrier layer 1330. The width 1331 of the fin-type channel layer 1340 may be smaller than the width 1321 of the first buffer layer 1320. In the embodiment of the invention, the semiconductor device 1300 includes the second buffer layer 1322 which may be disposed above at least a portion of the first buffer layer 1320 and below the barrier layer 1330. In another embodiment of the invention, the second buffer layer 1322 may not be formed in the semiconductor device 1300, and the barrier layer 1330 may be formed directly on the first buffer layer 1320.

In the embodiment of the invention, the semiconductor device 1300 may include a first dielectric layer 1350 surrounding the barrier layer 1330 and the second buffer layer 1322. In the embodiment of the invention, the width 1323 of the second buffer layer 1322 may be substantially equal to the width 1331 of the barrier layer 1330. In the embodiment of the invention, the semiconductor device 1300 may further include a second dielectric layer 1352 surrounding at least a portion of the fin-type channel layer 1340. In the embodiment of the invention, at least a portion of the fin-type channel layer 1340 may protrude from a top surface 1353 of the second dielectric layer 1352. In the embodiment of the invention, the width 1331 of the fin-type channel layer 1340 may be smaller than the width 1331 of the barrier layer 1330, and the width 1331 of the barrier layer 1330 may be smaller than the width 1321 of the first buffer layer 1320.

Figure 14:
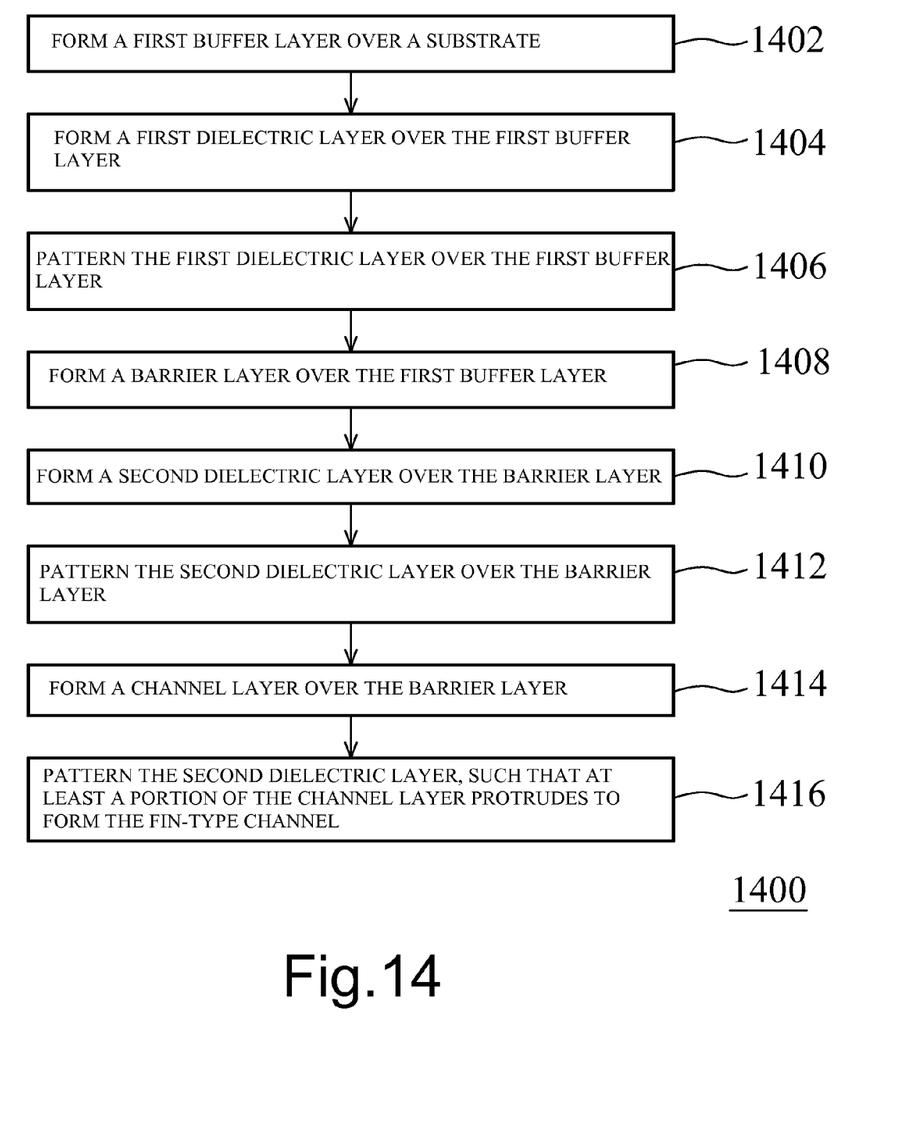
FIG. 14 is a flow chart for forming a semiconductor device having a fin-type channel according to an exemplary embodiment of the invention.

FIG. 14 is a flow chart for forming a semiconductor device having a fin-type channel according to an exemplary embodiment of the invention. As shown in FIG. 14, the method 1400 may include the following operations: forming a first buffer layer over a substrate (1402); forming a first dielectric layer over the first buffer layer (1404); patterning the first dielectric layer over the first buffer layer (1406); forming a barrier layer over the first buffer layer (1408); forming a second dielectric layer over the barrier layer (1410); patterning the second dielectric layer over the barrier layer (1412); forming a channel layer over the barrier layer (1414); and patterning the second dielectric layer, such that at least a portion of the channel layer protrudes to form the fin-type channel (1416).

Figure 15:
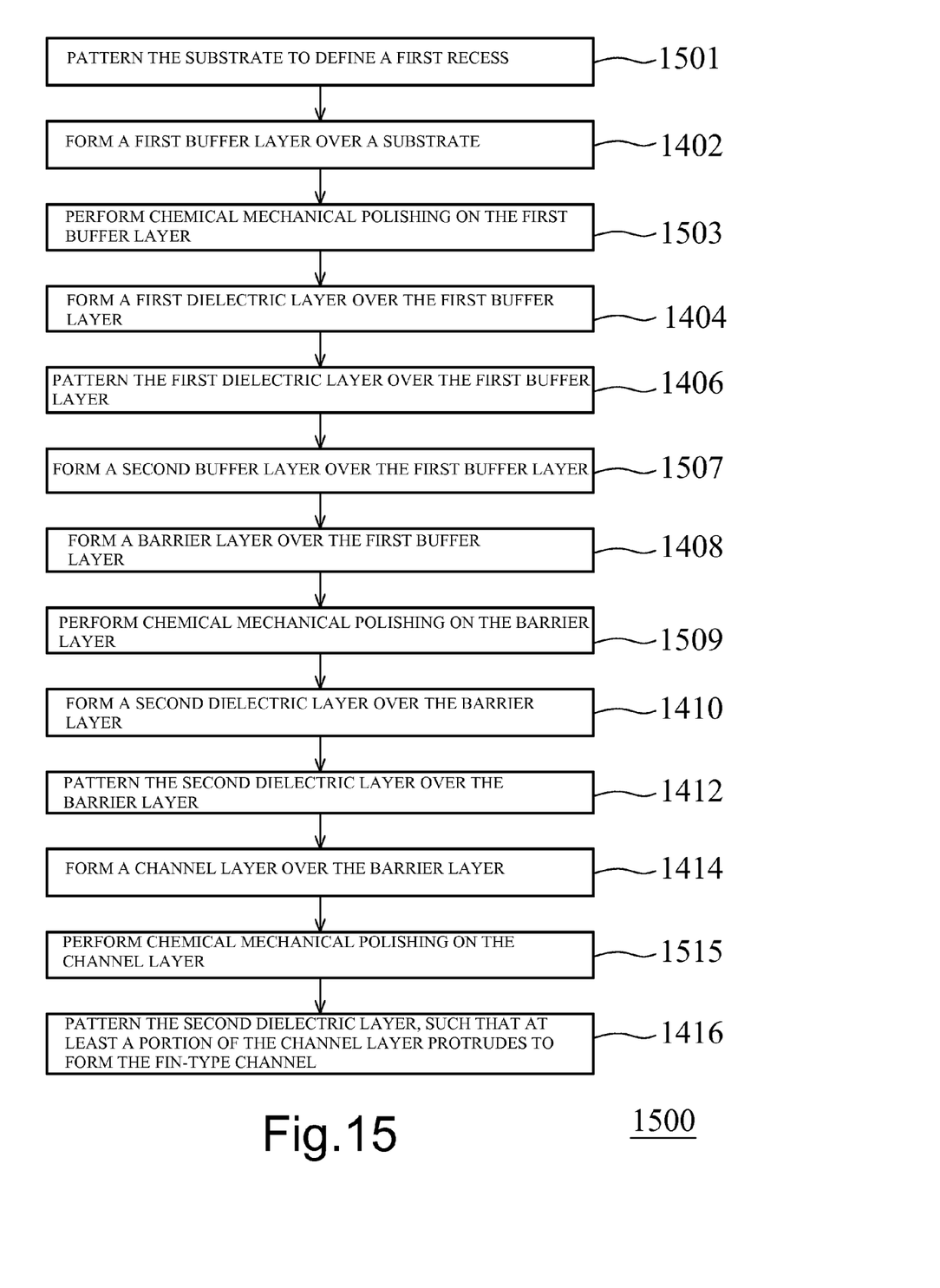
FIG. 15 is a flow chart for forming a semiconductor device having a fin-type channel according to an exemplary embodiment of the invention.

FIG. 15 is a flow chart for forming a semiconductor device having a fin-type channel according to an exemplary embodiment of the invention. As shown in FIG. 15, the method 1500 may include the following operations: patterning the substrate to define a first recess (1501); forming a first buffer layer over a substrate (1402); performing chemical mechanical polishing on the first buffer layer (1503); forming a first dielectric layer over the first buffer layer (1404); patterning the first dielectric layer over the first buffer layer (1406); forming a second buffer layer over the first buffer layer (1507); forming a barrier layer over the first buffer layer (1408); performing chemical mechanical polishing on the barrier layer (1509); forming a second dielectric layer over the barrier layer (1410); patterning the second dielectric layer over the barrier layer (1412); forming a channel layer over the barrier layer (1414); performing chemical mechanical polishing on the channel layer (1515); and patterning the second dielectric layer, such that at least a portion of the channel layer protrudes to form the fin-type channel (1416).

In the exemplary embodiment, the operation of forming the first buffer layer over the substrate may further include forming the first buffer layer in the first recess. In the exemplary embodiment, the operation of patterning the first dielectric layer over the first buffer layer may further include patterning the first dielectric layer to define a second recess. In the exemplary embodiment, the operation of patterning the substrate to define the first recess may further include defining the first recess having a first width, and the operation of patterning the first dielectric layer to define the second recess may further include defining the second recess having a second width, wherein the second width is smaller than the first width. In the exemplary embodiment, the operation of forming the barrier layer over the first buffer layer may further include forming the barrier layer in the second recess. In the exemplary embodiment, the operation of patterning the second dielectric layer over the barrier layer may further include patterning the second dielectric layer to define a third recess. In the exemplary embodiment, the operation of patterning the second dielectric layer to define a third recess may further include defining the third recess having a third width, wherein the third width is smaller than the second width. In the exemplary embodiment, the operation of forming the channel layer over the barrier layer may further include forming the channel layer in the third recess. In the exemplary embodiment, the operation of patterning the second dielectric layer may further include etching back the second dielectric layer.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method for forming a semiconductor device having a fin-type channel, comprising: forming a first buffer layer over a substrate; forming a first dielectric layer over the first buffer layer; patterning the first dielectric layer over the first buffer layer to define a recess; forming a barrier layer over the first buffer layer; forming a second dielectric layer over the barrier layer such that a portion of the barrier layer is completely between the second dielectric layer and the substrate along a line normal to the barrier layer; patterning the second dielectric layer over the barrier layer; forming a channel layer over the barrier layer; and patterning the second dielectric layer such that at least a portion of the channel layer protrudes to form the fin-type channel.

2. The method of claim 1, further comprising patterning the substrate to define a first recess.

3. The method of claim 2, further comprising forming the first buffer layer in the first recess.

4. The method of claim 1, further comprising patterning the substrate to define a first recess having a first width, wherein patterning the first dielectric layer to define the recess comprises defining the recess in the first dielectric layer to have a second width smaller than the first width.

5. The method of claim 1, wherein forming the barrier layer over the first buffer layer further comprises forming the barrier layer in the recess in the first dielectric layer.

6. The method of claim 1, further comprising performing chemical mechanical polishing on at least one of the first buffer layer, the barrier layer, or the channel layer.

7. The method of claim 1, further comprising forming a second buffer layer over the first buffer layer.

8. The method of claim 7, wherein forming the second buffer layer over the first buffer layer further comprises forming the second buffer layer in the recess in the first dielectric layer.

9. The method of claim 1, wherein patterning the second dielectric layer over the barrier layer comprises patterning the second dielectric layer to define a third recess.

10. The method of claim 9, wherein patterning the first dielectric layer to define the recess comprises defining the recess in the first dielectric layer to have a second width and patterning the second dielectric layer to define the third recess comprises defining the third recess having a third width smaller than the second width.

11. The method of claim 9, wherein forming the channel layer over the barrier layer further comprises forming the channel layer in the third recess.

12. The method of claim 1, further comprising:
forming one or more layers between the barrier layer and the substrate; or
forming one or more layers between the barrier and the second dielectric layer.

13. The method of claim 1, wherein patterning the second dielectric layer such that at least a portion of the channel layer protrudes to form the fin-type channel leaves a portion of the channel layer in contact with a portion of the second dielectric layer.

14. The method of claim 1, wherein the barrier layer is formed of AlInAs or AlAsSb.

15. A method for forming a semiconductor device having a fin-type channel, comprising:
forming a buffer layer over a substrate;
forming a first dielectric layer over the buffer layer;
patterning the first dielectric layer over the buffer layer;
forming a barrier layer over the buffer layer and adjacent to a remaining portion of the first dielectric layer;
forming a second dielectric layer over the barrier layer;
patterning the second dielectric layer to define a recess;
forming a channel layer over the barrier layer; and patterning the second dielectric layer such that at least a portion of the channel layer protrudes to form the fin-type channel.

16. The method of claim 15, wherein patterning the first dielectric layer over the buffer layer comprises patterning the first dielectric layer to define a second recess having a second width and patterning the second dielectric layer to define the recess comprises defining the recess in the second dielectric layer to have a third width smaller than the second width.

17. The method of claim 15, wherein forming the channel layer over the barrier layer further comprises forming the channel layer in the recess in the second dielectric layer.

18. The method of claim 15, further comprising:
forming one or more layers between the barrier layer and the substrate or forming one; or
more layers between the barrier and the second dielectric layer.

19. The method of claim 15, wherein patterning the second dielectric layer such that at least a portion of the channel layer protrudes to form the fin-type channel leaves a portion of the channel layer in contact with a portion of the second dielectric layer.

20. A method for forming a semiconductor device having a fin-type channel, comprising:
patterning a substrate to define a first recess;
forming a first buffer layer in the first recess having a first width;
forming a first dielectric layer over the first buffer layer;
patterning the first dielectric layer over the first buffer layer to define a second recess having a second width smaller than the first width;
forming a barrier layer in the second recess;
forming a second dielectric layer over the barrier layer;
patterning the second dielectric layer over the barrier layer to define a third recess having a third width smaller than the second width;
forming a channel layer in the third recess; and
patterning the second dielectric layer, such that at least a portion of the channel layer protrudes to form the fin-type channel.

* * * * *